US008680617B2

(12) United States Patent
Li et al.

(10) Patent No.: US 8,680,617 B2
(45) Date of Patent: Mar. 25, 2014

(54) SPLIT LEVEL SHALLOW TRENCH ISOLATION FOR AREA EFFICIENT BODY CONTACTS IN SOI MOSFETS

(75) Inventors: Ying Li, Newburgh, NY (US); Shreesh Narasimha, Beacon, NY (US); Werner A. Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 481 days.

(21) Appl. No.: 12/574,126

(22) Filed: Oct. 6, 2009

(65) Prior Publication Data

US 2011/0079851 A1 Apr. 7, 2011

(51) Int. Cl.
*H01L 27/12* (2006.01)

(52) U.S. Cl.
USPC .......... 257/347; 257/40; 257/59; 257/61; 257/288; 257/345

(58) Field of Classification Search
USPC .......... 257/40, 59, 61, 327, 333, 345–347, 257/314–326, 401–403, 105, 288
See application file for complete search history.

(56) References Cited

U.S. PATENT DOCUMENTS

| | | | | |
|---|---|---|---|---|
| 5,185,280 A | * | 2/1993 | Houston et al. | 438/163 |
| 5,693,959 A | * | 12/1997 | Inoue et al. | 257/66 |
| 5,712,205 A | * | 1/1998 | Park et al. | 438/425 |
| 5,728,620 A | * | 3/1998 | Park | 438/425 |
| 5,767,549 A | * | 6/1998 | Chen et al. | 257/347 |
| 5,858,842 A | * | 1/1999 | Park | 438/297 |
| 5,869,874 A | * | 2/1999 | Manning | 257/382 |
| 5,872,383 A | * | 2/1999 | Yagishita | 257/409 |
| 5,929,490 A | * | 7/1999 | Onishi | 257/347 |
| 6,159,780 A | * | 12/2000 | Nam | 438/163 |
| 6,252,280 B1 | * | 6/2001 | Hirano | 257/347 |
| 6,337,230 B2 | * | 1/2002 | Hirano | 438/149 |
| 6,348,714 B1 | | 2/2002 | Lin et al. | |
| 6,368,903 B1 | * | 4/2002 | Bryant et al. | 438/151 |
| 6,391,793 B2 | * | 5/2002 | Lee et al. | 438/745 |
| 6,392,277 B1 | * | 5/2002 | Mitani et al. | 257/347 |
| 6,407,429 B1 | * | 6/2002 | Ko et al. | 257/350 |
| 6,423,997 B1 | * | 7/2002 | Takahashi | 257/298 |
| 6,429,487 B1 | * | 8/2002 | Kunikiyo | 257/354 |
| 6,436,744 B1 | | 8/2002 | Bryant et al. | |

(Continued)

OTHER PUBLICATIONS

Naoki Kotani et al., Suppression of Leakage Current in SOI CMOS LSIs by Using Silicon-Sidewall Body-Contact (SSBC) Technology, 2002 Symposium on VLSI Technology Digest of Technical Papers, pp. 44-45 (2002).

(Continued)

*Primary Examiner* — Alexander Sofocleous
*Assistant Examiner* — Ankush Singal
(74) *Attorney, Agent, or Firm* — Ira D. Blecker; Joseph Petrokaitis; Matthew C. Zehrer

(57) ABSTRACT

Disclosed is an SOI device on a bulk silicon layer which has an FET region, a body contact region and an STI region. The FET region is made of an SOI layer and an overlying gate. The STI region includes a first STI layer separating the SOI device from an adjacent SOI device. The body contact region includes an extension of the SOI layer, a second STI layer on the extension and a body contact in contact with the extension. The first and second STI layers are contiguous and of different thicknesses so as to form a split level STI.

17 Claims, 15 Drawing Sheets

(56) References Cited

U.S. PATENT DOCUMENTS

| | | | |
|---|---|---|---|
| 6,495,898 B1* | 12/2002 | Iwamatsu et al. | 257/506 |
| 6,521,959 B2* | 2/2003 | Kim et al. | 257/397 |
| 6,537,861 B1* | 3/2003 | Kroell et al. | 438/149 |
| 6,611,024 B2* | 8/2003 | Ang et al. | 257/350 |
| 6,624,475 B2* | 9/2003 | Bryant et al. | 257/347 |
| 6,670,716 B2* | 12/2003 | Christensen et al. | 257/762 |
| 6,703,280 B2* | 3/2004 | Kim et al. | 438/301 |
| 6,794,716 B2* | 9/2004 | Park et al. | 257/347 |
| 6,815,282 B2 | 11/2004 | Dachtera et al. | |
| 6,815,296 B2* | 11/2004 | Dennard et al. | 438/283 |
| 6,930,359 B2* | 8/2005 | Ushiku | 257/347 |
| 6,933,569 B2* | 8/2005 | Koh et al. | 257/347 |
| 6,940,130 B2* | 9/2005 | Bryant et al. | 257/350 |
| 6,998,682 B2* | 2/2006 | Chan et al. | 257/347 |
| 7,135,731 B2* | 11/2006 | Hsiao et al. | 257/301 |
| 7,332,776 B2* | 2/2008 | Iwamatsu et al. | 257/347 |
| 7,402,865 B2* | 7/2008 | Ipposhi et al. | 257/347 |
| 7,432,154 B2* | 10/2008 | Kamiya | 438/258 |
| 7,432,560 B2* | 10/2008 | Lim et al. | 257/382 |
| 7,553,709 B2* | 6/2009 | Zhu et al. | 438/149 |
| 7,553,741 B2* | 6/2009 | Ipposhi | 438/425 |
| 7,888,738 B2* | 2/2011 | Tessier et al. | 257/347 |
| 7,964,897 B2* | 6/2011 | Fechner et al. | 257/213 |
| 7,986,029 B2* | 7/2011 | Chuang et al. | 257/618 |
| 8,232,597 B2* | 7/2012 | Stuber et al. | 257/347 |
| 8,299,544 B2* | 10/2012 | Abou-Khalil et al. | 257/401 |
| 2001/0025991 A1* | 10/2001 | Kim | 257/347 |
| 2002/0022328 A1 | 2/2002 | Ang et al. | |
| 2002/0030229 A1* | 3/2002 | Christensen et al. | 257/347 |
| 2002/0047158 A1* | 4/2002 | Park et al. | 257/347 |
| 2002/0089031 A1* | 7/2002 | Ang et al. | 257/506 |
| 2002/0098631 A1* | 7/2002 | Chang et al. | 438/155 |
| 2002/0100939 A1* | 8/2002 | Iwamatsu et al. | 257/351 |
| 2002/0105032 A1* | 8/2002 | Lee et al. | 257/349 |
| 2002/0115244 A1* | 8/2002 | Park et al. | 438/152 |
| 2002/0142552 A1 | 10/2002 | Wu | |
| 2003/0203546 A1* | 10/2003 | Burbach et al. | 438/151 |
| 2004/0056309 A1* | 3/2004 | Kim | 257/347 |
| 2004/0079995 A1* | 4/2004 | Bryant et al. | 257/347 |
| 2005/0093104 A1* | 5/2005 | Ieong et al. | 257/627 |
| 2005/0127442 A1* | 6/2005 | Veeraraghavan et al. | 257/347 |
| 2006/0019434 A1* | 1/2006 | Jeong et al. | 438/152 |
| 2006/0043494 A1* | 3/2006 | Ipposhi et al. | 257/369 |
| 2006/0081895 A1* | 4/2006 | Lee et al. | 257/288 |
| 2006/0118872 A1* | 6/2006 | Kato | 257/347 |
| 2006/0189050 A1* | 8/2006 | Jones | 438/154 |
| 2007/0108531 A1* | 5/2007 | Chidambarrao | 257/374 |
| 2007/0176235 A1* | 8/2007 | Tsujiuchi et al. | 257/347 |
| 2007/0210380 A1* | 9/2007 | Lee | 257/347 |
| 2007/0241365 A1* | 10/2007 | Iwamatsu | 257/147 |
| 2007/0262411 A1* | 11/2007 | Rauscher | 257/506 |
| 2008/0083949 A1* | 4/2008 | Zhu et al. | 257/347 |
| 2008/0173940 A1* | 7/2008 | Miller et al. | 257/339 |
| 2008/0191788 A1* | 8/2008 | Chen et al. | 327/537 |
| 2008/0261387 A1* | 10/2008 | Ipposhi et al. | 438/533 |
| 2008/0290426 A1* | 11/2008 | Miller et al. | 257/408 |
| 2009/0250772 A1* | 10/2009 | Botula et al. | 257/408 |
| 2009/0315138 A1* | 12/2009 | Chang et al. | 257/506 |
| 2010/0019320 A1* | 1/2010 | Fechner et al. | 257/347 |

OTHER PUBLICATIONS

International Search Report dated Apr. 27, 2011.

\* cited by examiner

SPLIT LEVEL SHALLOW TRENCH ISOLATION FOR AREA EFFICIENT BODY CONTACTS IN SOI MOSFETS

BACKGROUND OF THE INVENTION

The present invention relates to semiconductor-on-insulator (SOI) devices and methods for fabricating the same. More particularly, the body of a semiconductor-on-insulator device is tied to the grounded substrate to improve threshold voltage control and reduce history effects. The body is grounded without a so-called Tbody or Hbody contact scheme. This new body contact structure reduces the high parasitic capacitance associated with conventional body contacts.

Silicon-on-insulator (SOI) technology has become an increasingly important technique utilized in the fabrication and production of semiconductor devices. SOI technology deals with the formation of transistors in a relatively thin mono crystalline semiconductor layer, which overlays an insulating layer. In other words, the active devices are formed in a thin semiconductor disposed on an insulator layer rather than in the bulk semiconductor of the device.

In a typical SOI transistor, the body is generally isolated from the silicon substrate and usually kept floating. This may result in problems for current-sensitive circuit applications, since the body typically retains charge from the previous time the transistor was utilized. The retained charge within the body interferes with subsequent use of the device. A variety of solutions have been proposed to address the problems associated with the SOI semiconductor device. For example, the use of a body contact in the SOI device addresses this problem, and also allows the threshold voltage to be changed so that standby power can be reduced for low-power applications. The body contact in the SOI device has conventionally been made by the use of a T-shaped or a H-shaped polysilicon structure on an active area, thereby creating three distinct regions including a source region, a drain region, and a body contact region.

However, the T-shaped or H-shaped polysilicon structure layout cost area and increase the power dissipated in the circuit.

BRIEF SUMMARY OF THE INVENTION

The various advantages and purposes of the present invention as described above and hereafter are achieved by providing, according to a first aspect of the invention, an SOI device comprising:
an FET region comprising an SOI layer;
an STI region having a first STI layer separating the SOI device from an adjacent SOI device, the first STI layer having a first thickness;
a body contact region between the FET region and STI region, the body contact region having an extension of the SOI layer and an overlying second STI layer having a second thickness; and
a body contact in contact with the SOI extension;
wherein the first thickness is different than the second thickness.

According to a second aspect of the invention, there is provided an SOI device comprising:
a bulk silicon layer;
an FET region, body contact region and STI region;
the FET region comprising an SOI layer and a gate on the SOI layer;
the STI region having a first STI layer separating the SOI device from an adjacent SOI device, the first STI layer having a first thickness;
the body contact region between the FET region and STI region, the body contact region having an extension of the SOI layer and an overlying second STI layer having a second thickness; and
a body contact in contact with the SOI extension;
wherein the first thickness is different than the second thickness.

According to a third aspect of the invention, there is provided a method of forming an SOI device comprising the steps of:
forming an FET region comprising an SOI layer;
forming an STI region having a first STI layer separating the SOI device from an adjacent SOI device, the first STI layer having a first thickness;
forming a body contact region between the FET region and STI region, the body contact region having an extension of the SOI layer and an overlying second STI layer having a second thickness; and
forming a body contact in contact with the SOI extension;
wherein the first thickness is different than the second thickness.

According to a fourth aspect of the invention, there is provided a method of forming an SOI device comprising the steps of:
obtaining a wafer having a bulk silicon layer;
forming a buried oxide layer on the bulk silicon;
forming a silicon layer on the buried oxide layer, the patterned silicon layer forming a first portion and an extension contiguous with the first portion, the extension being thinner than the first portion;
forming an oxide layer comprising a first STI region on the buried oxide layer and adjacent to the extension and a second STI region on the extension, the first and second STI regions forming a contiguous split level STI such that the first and second STI regions having different thicknesses;
forming a gate on the first portion of the silicon layer, the gate and first portion of the silicon layer comprising an FET region;
a body contact in contact with the extension wherein the body contact, extension and second STI layer form a body contact region.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
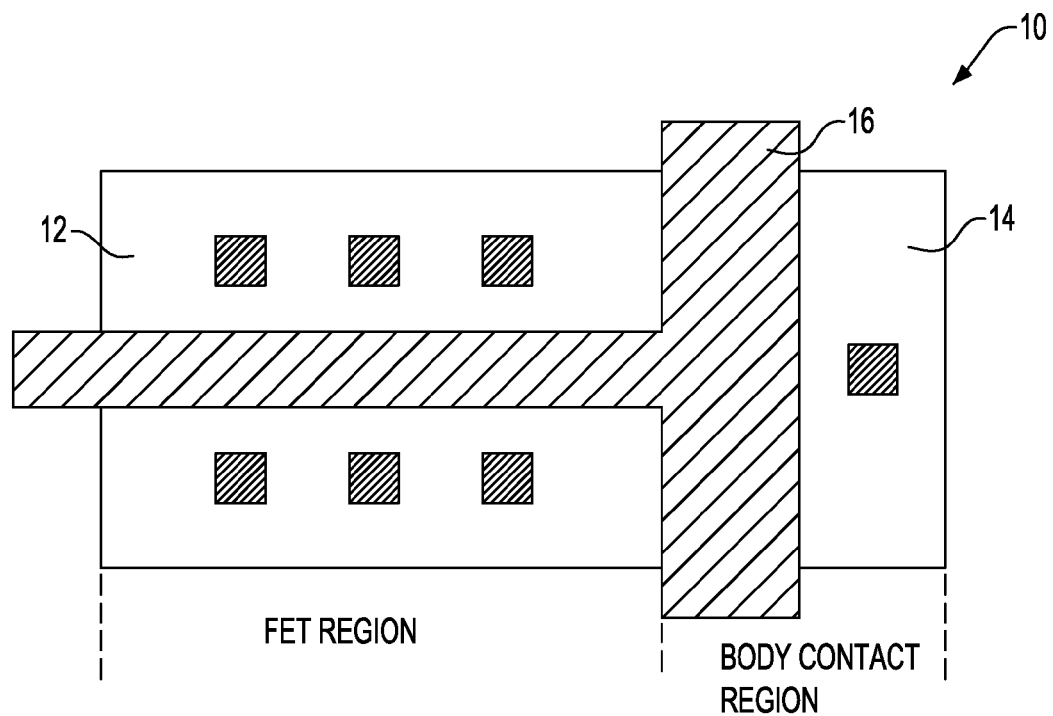
FIG. 1 is a pictorial representation of a prior art T-body contact.

Referring to the Figures in more detail, and particularly referring to FIG. 1, there is shown an SOI device 10 having an FET region 12 and a body contact region 14. A conventional T-shaped gate polysilicon layer 16, separates the body contact region 14 from the FET region 12. Problems with the arrangement of SOI device 10 include the area used and extra gate capacitance.

Figure 2:
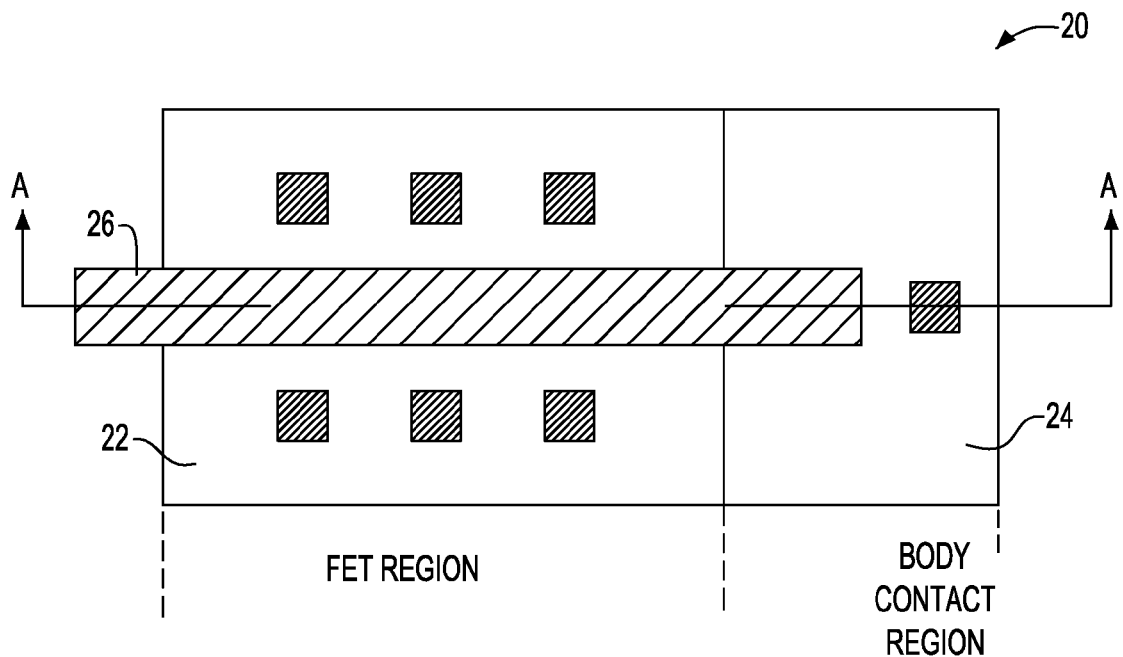
FIG. 2 is a pictorial representation of an SOI device having a body contact according to the present invention.

Referring now to FIG. 2, there is shown an SOI device 20 according to the present invention having an FET region 22, a body contact region, nominally indicated by reference number 24 and a gate polysilicon layer 26. It should be understood, however, that the body contact region 24 is actually submerged below the surface of FET region 22, as will become apparent hereafter. The SOI device 20 shown in FIG. 2 has a body contact which does not utilize a T-shaped or H-shaped gate polysilicon layer. The present invention utilizes two levels of shallow trench isolation (STI) to form the body contact region 24 and an adjacent STI region.

Figure 3:
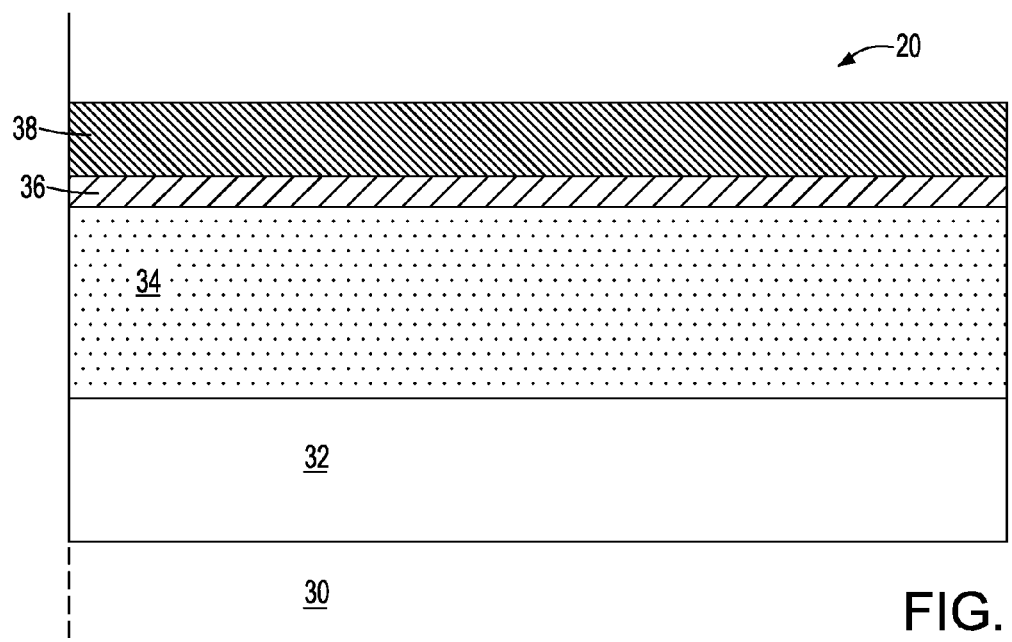
FIGS. 3 to 14 illustrate a process of making the SOI device of FIG. 2 except for the body contacts.

The process to make the SOI device 20 is illustrated in FIGS. 3-14, which are cross sections in the direction of arrows A-A shown in FIG. 2. Referring now to FIG. 3, bulk silicon substrate 30 has sequential layers of buried oxide (hereafter "BOX") 32, a thin layer of silicon 34 (hereafter "SOI layer"), pad oxide layer 36, and insulator layer 38, which preferably is a pad nitride layer. For purposes of illustration and not limitation, the BOX 32 has an approximate thickness of 50-300 nm, the SOI layer 34 has an approximate thickness of 30-100 nm, the pad oxide layer 36 has an approximate thickness of 3-10 nm and insulator layer 38 has an approximate thickness of 30-200 nm.

Figure 4:
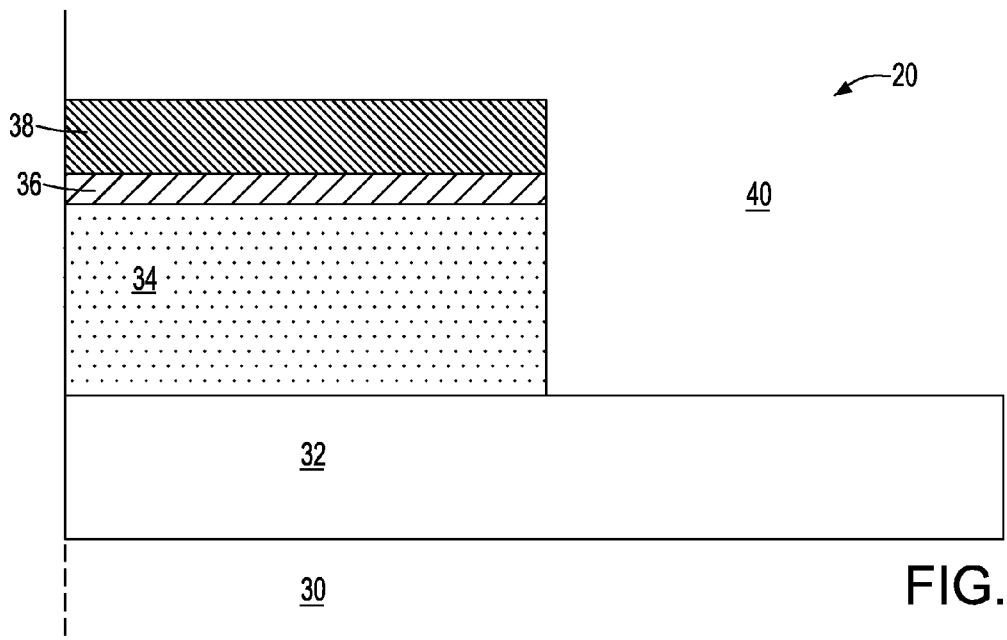

Referring now to FIG. 4, the SOI layer 34, pad oxide layer 36 and pad nitride layer 38 have been conventionally patterned and etched from BOX layer 32 in a portion of the SOI device 20 indicated by reference numeral 40.

Figure 5:
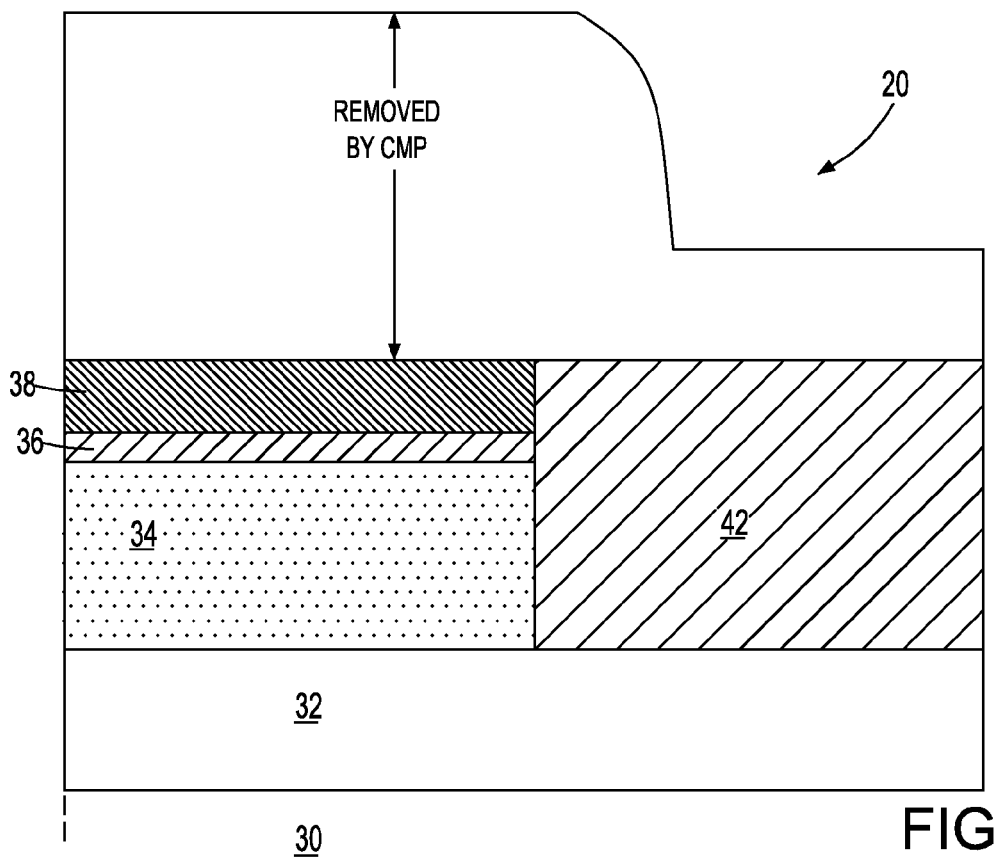

Referring now to FIG. 5, portion 40 of SOI device 20 is now filled with an oxide fill 42 and then planarized by chemical mechanical polishing (CMP) down to insulator layer 38.

Figure 6:
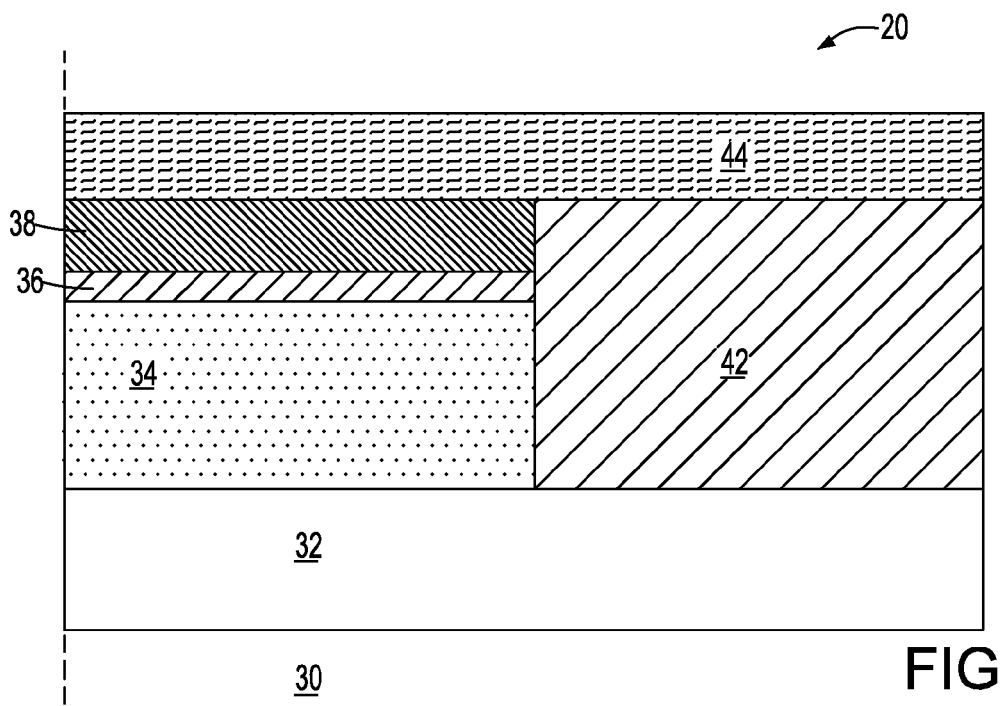

Referring now to FIG. 6, a layer of nitride 44 is deposited over pad nitride layer 38 and oxide fill 42. Nitride layer 44 may have a thickness of about 30-100 nm.

Figure 7:
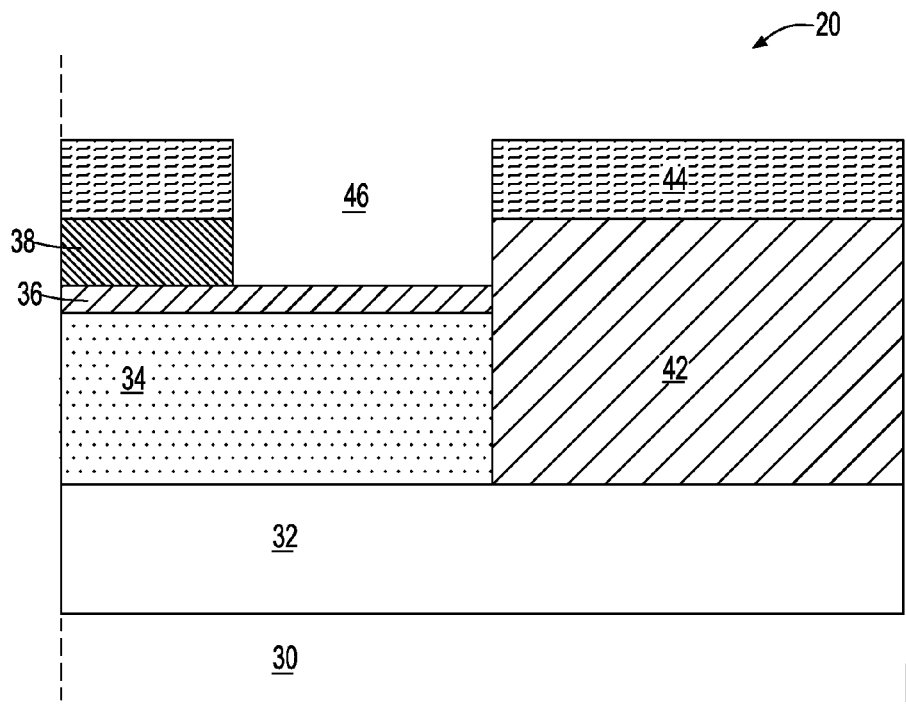

Referring now to FIG. 7, a portion of SOI device 20 has been patterned and etched by conventional means to remove part of the nitride layer 44 and pad nitride 38 to result in opening 46. The pad oxide layer 36 is exposed through opening 46.

Figure 8:
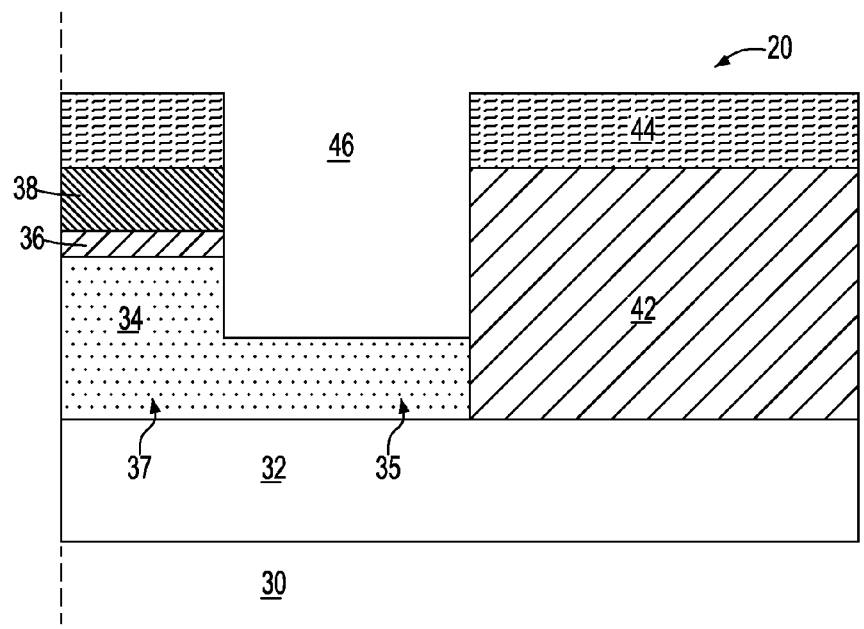

Referring now to FIG. 8, etching continues to increase opening 46 through pad oxide layer 36 and into SOI layer 34. As can be seen when comparing FIGS. 7 and 8, the thickness of SOI layer 34 is locally reduced by the formation of opening 46. The reduced thickness of SOI layer 34 underneath opening 46 forms an SOI extension 35 of the thicker part 37 of SOI layer 34 underneath pad oxide 36. SOI extension 35 of SOI layer 34 has an approximate thickness of 15-70 nm.

Figure 9:
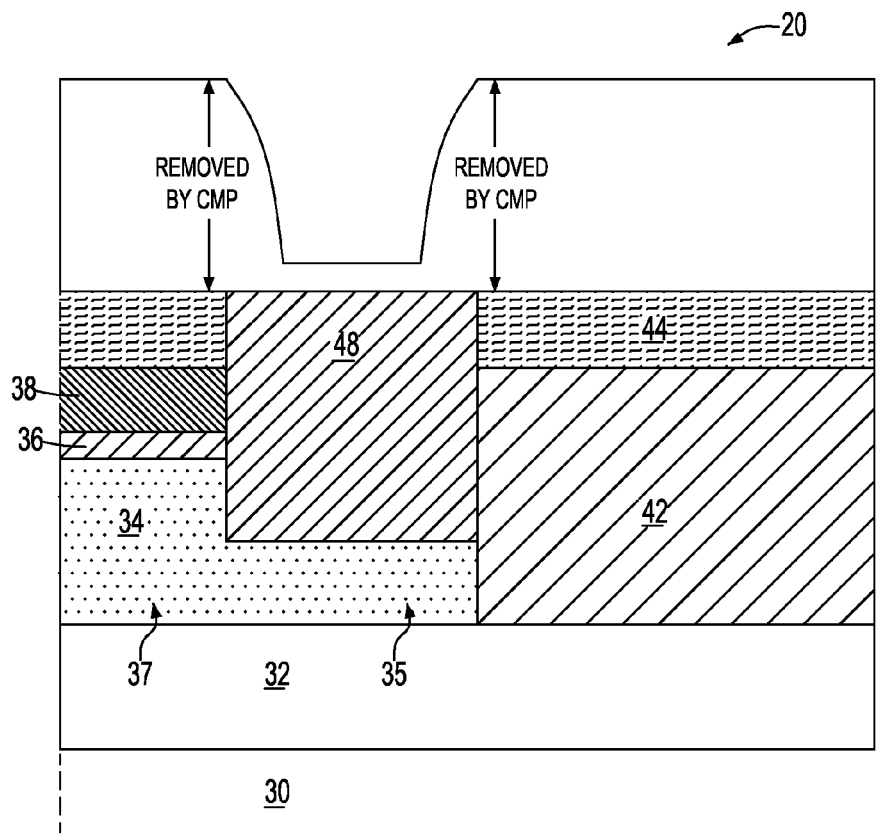

Referring now to FIG. 9, oxide 48 has been deposited into opening 46 and on top of nitride layer 44. Oxide layer 48 is then removed from the top of the nitride layer 44 by CMP as shown in FIG. 9.

Figure 10:
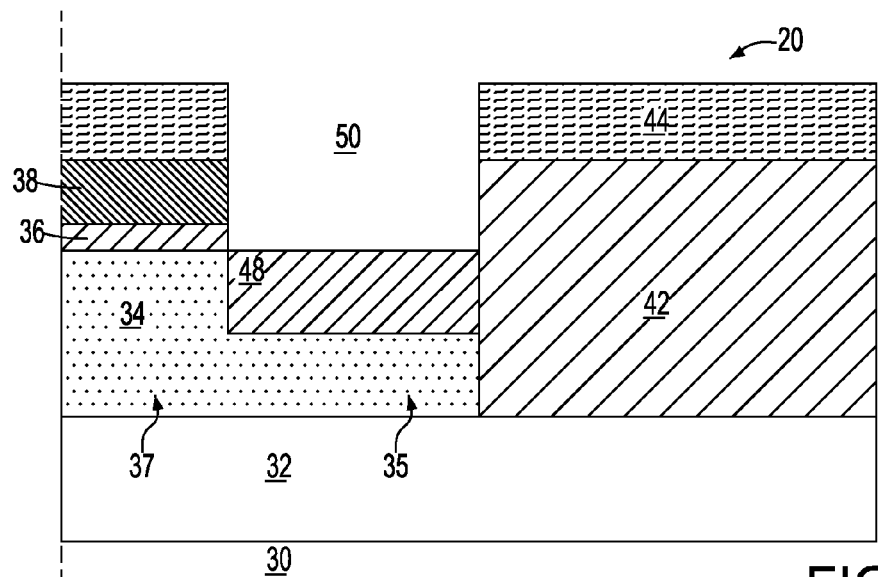

Referring now to FIG. 10, oxide 48 has been etched back by conventional means to result in opening 50. The processing objective is for oxide 48 and pad oxide layer 36 to be approximately of the same level although this may not always be obtainable in practice. Accordingly, it is within the scope of the present invention for oxide 48 and pad oxide layer 36 to be at somewhat different levels as shown in FIG. 10.

Figure 11:
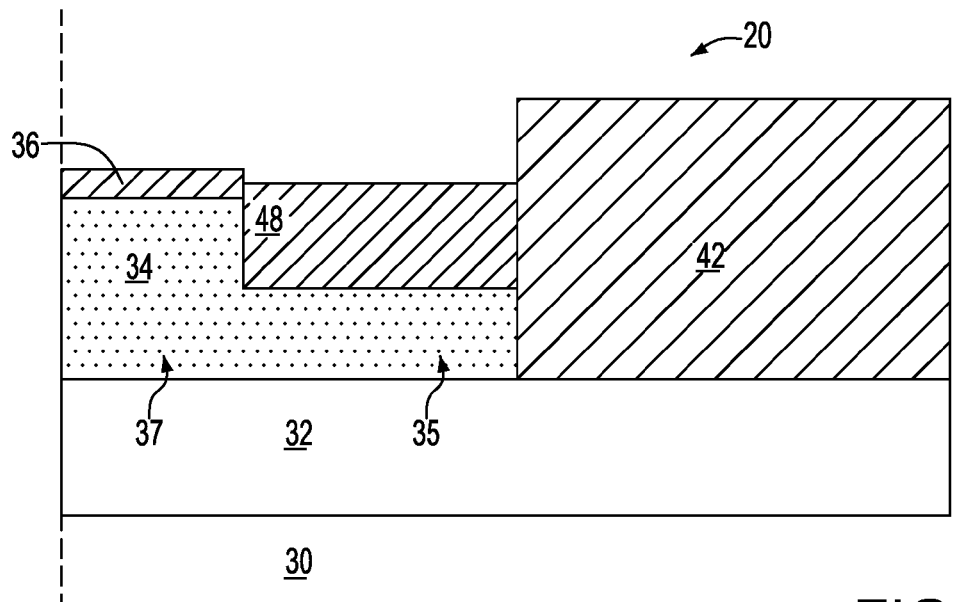

Referring now to FIG. 11, nitride layers 44 and 38 have been stripped using a selective etch such as hot phosphoric acid.

Figure 12:
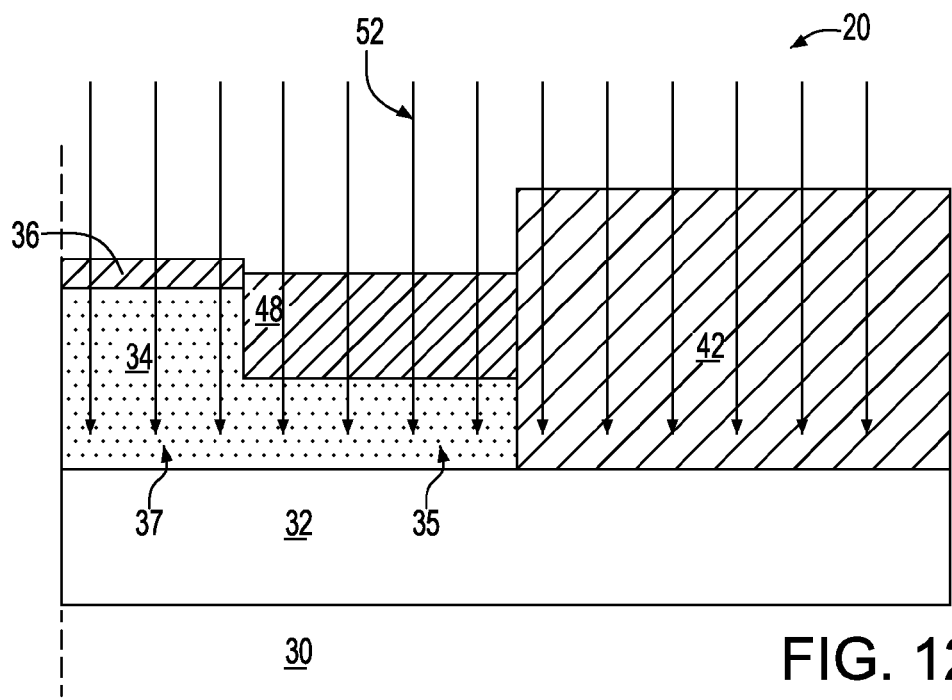

Referring now to FIG. 12, an optional deep well implant 52 is performed for low body resistance. A p-type dopant such as boron is implanted into the n-channel FETs, while an n-type dopant such as arsenic or phosphorus is implanted into the p-channel FETs. The energy and dose of the implants are chosen so that the dopant concentration in the SOI extension 35 of the SOI layer 34 below the oxide layer 48 is maximized without significantly affecting the threshold voltage of the transistor.

Figure 13:
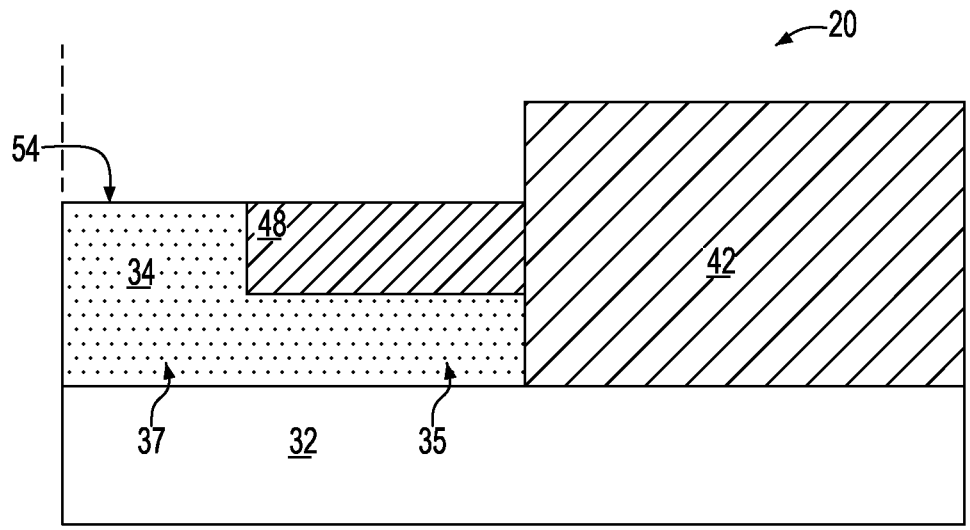

FIG. 13 shows the SOI device 20 after the removal of pad oxide 36 immediately prior to gate oxide growth or deposition. Oxide layer 48 is approximately flush with the surface 54 of SOI layer 34 but is at a different level (lower) than oxide fill 42. A conventional CMOS process flow is now followed through the gate deposition and patterning, extension and halo implantations and spacer formations as is well known in the art.

Figure 14:
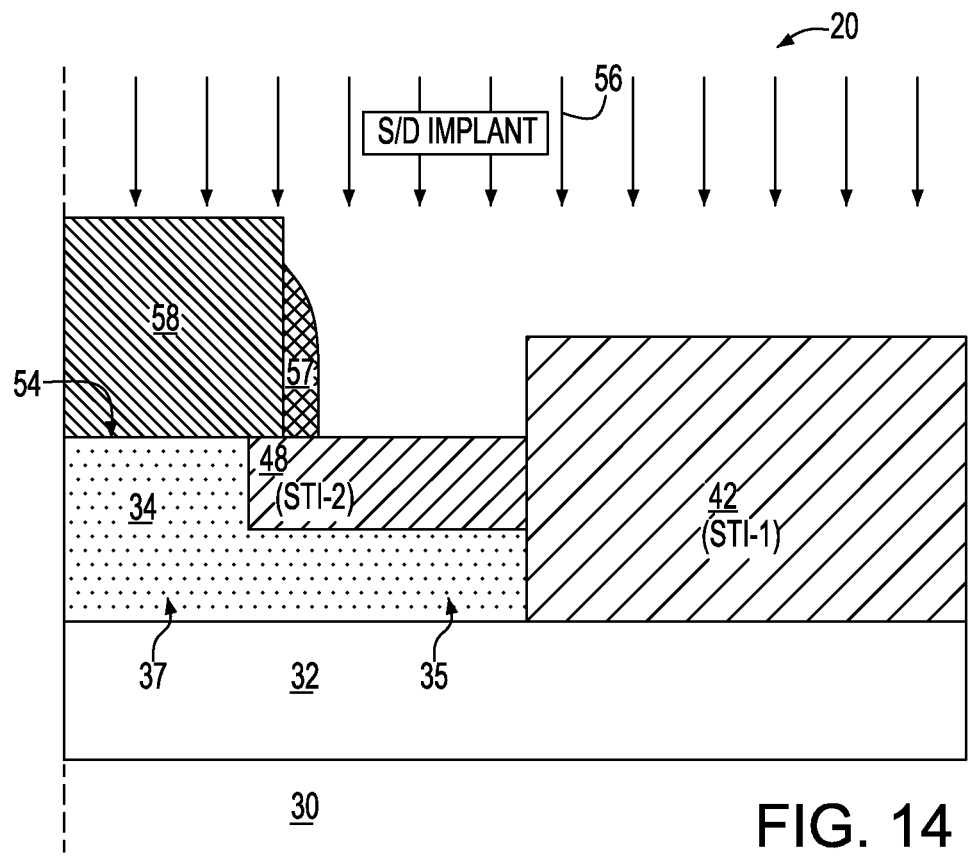

Referring now to FIG. 14, a conventional polysilicon gate 58 and source/drain spacer 57 have been formed on the surface 54 of SOI layer 34. The end of the polysilicon gate 58 must extend partly over the SOI extension 35 of SOI layer 34 and oxide layer 48. This polysilicon gate 58 will be in FET region 22 of the finished device. A conventional source/drain implant 56 is performed. Oxide layer 48 is of sufficient thickness that the implant 56 does not penetrate into the SOI extension 35 of SOI layer 34. The remaining oxide fill 42 and oxide layer 48 form first shallow trench isolation (STI-1) and second shallow trench isolation (STI-2), respectively, in the finished SOI device 20. STI-1 separates SOI device 20 from adjacent SOI devices. STI-2 is located in the body contact region 24 of the finished SOI device 20. STI-1 and STI-2 form contiguous split-level shallow trench isolations. The STI-2 isolation allows for a direct contact to the thicker portion 37 of SOI layer 34, hereafter body 37 of an FET, when the STI-2 isolation is placed adjacent to the end of the gate, since the thickness of STI-2 isolation region is designed to leave an SOI extension 35 of the SOI layer 34 under the STI-2 layer 48. The reason for manufacturing the SOI device 20 in the manner thus described is to provide an area efficient body contact which reduces the area requirements of the SOI device 20. The second shallow trench isolation region (STI-2) enables the etching of a contact hole through STI-2 and down to the SOI extension 35 of SOI layer 34 which is of the same conductivity type as the body 37 of the FET below the gate polysilicon 58. The STI-2 is thick enough to block the source/drain implant, which is of a dopant type that makes the source/drain the opposite conductivity type as the body 37 of the FET.

The process for forming the body contacts will now be described. There are two alternative processes for forming the body contacts. In one process, no silicide is used for the body contacts and in a second process, a silicide is used for the body contacts. The process for forming the body contacts without silicide will be described first in FIGS. 15 to 20.

Figure 15:
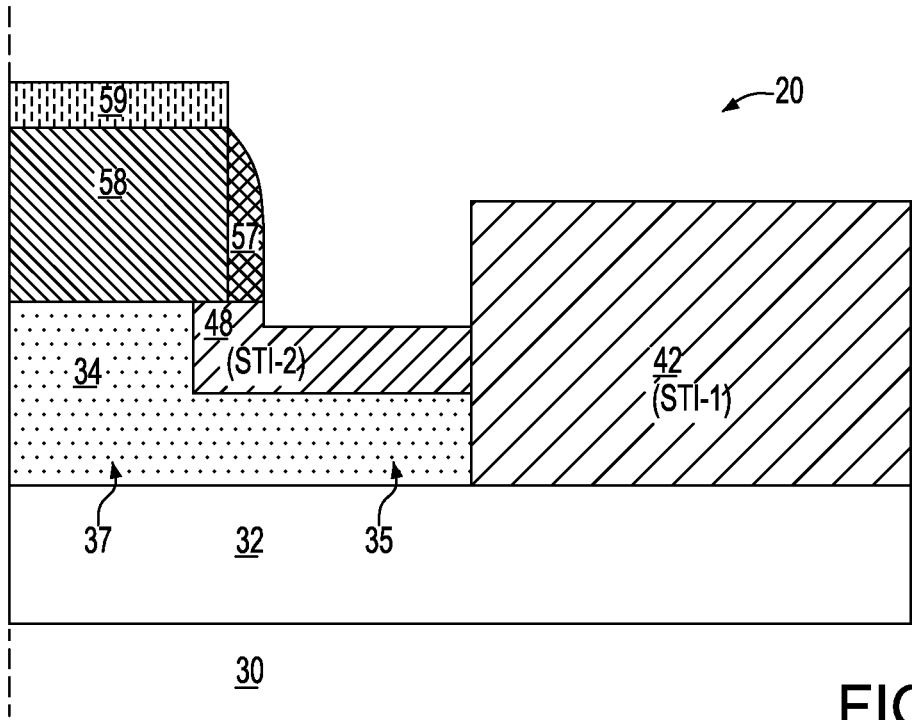
FIGS. 15 to 20 illustrate a first process for making body contacts for the SOI device of FIG. 2.

Referring now to FIG. 15, polysilicon gate 58 has been silicided to form a silicide layer 59 by a conventional self-aligned silicide formation process as is well known in the art. The thickness of the silicide layer 59 is approximately 5-30 nm.

Figure 16:
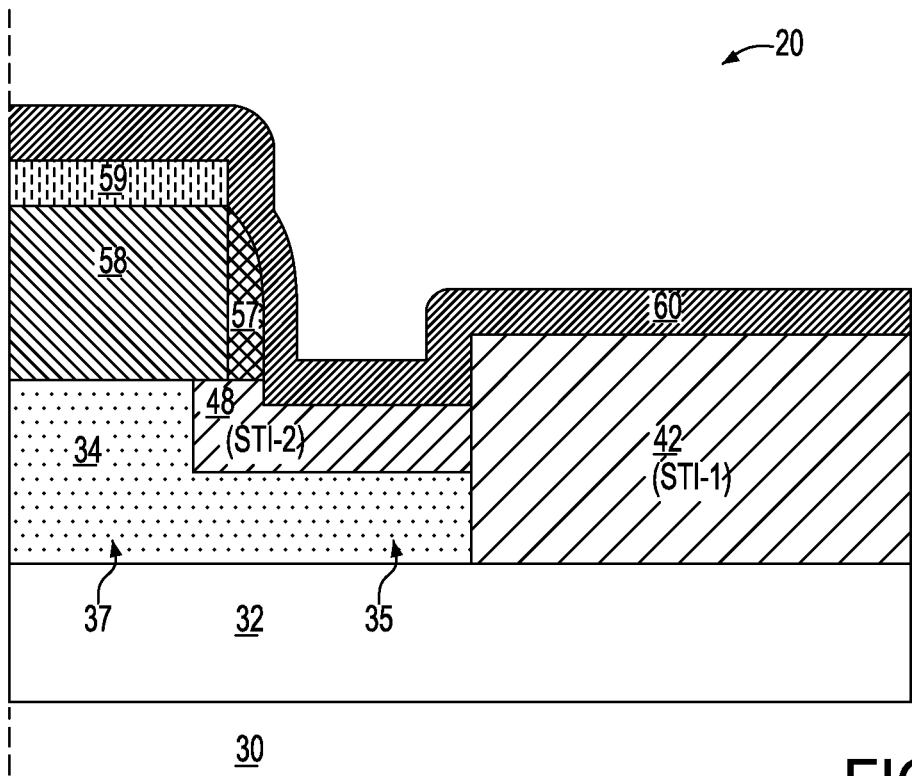

Referring now to FIG. 16, a conformal layer 60 of nitride has been applied over the SOI device 20. The thickness of conformal layer 60 is approximately 10-100 nm.

Figure 17:
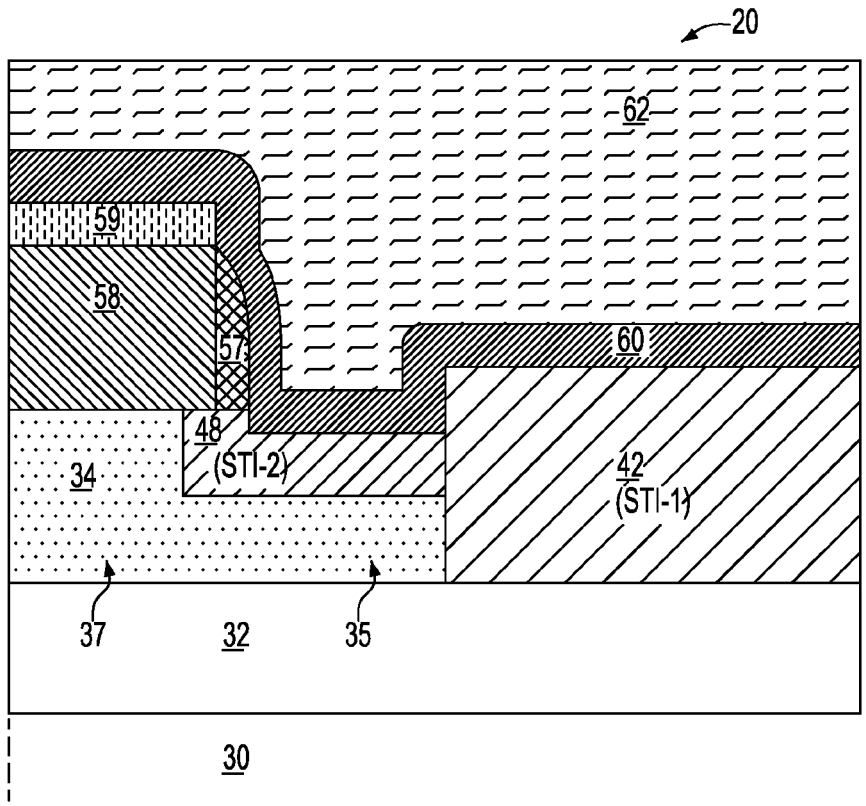

Referring now to FIG. 17, a layer of oxide 62 has been blanket deposited and then conventionally planarized by CMP.

Figure 18:
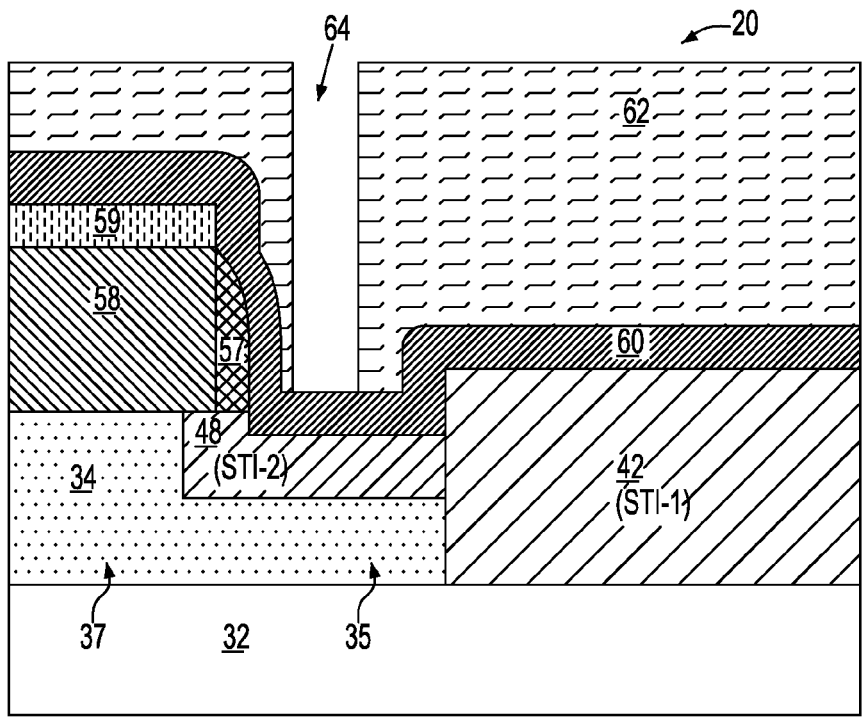
Figure 19:
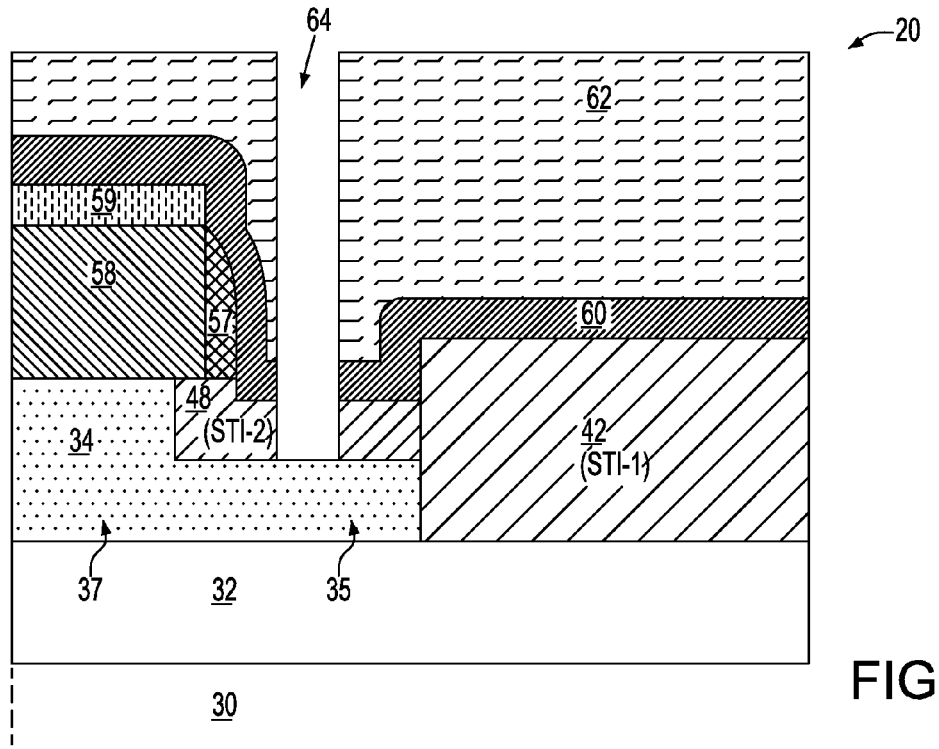
Figure 20:
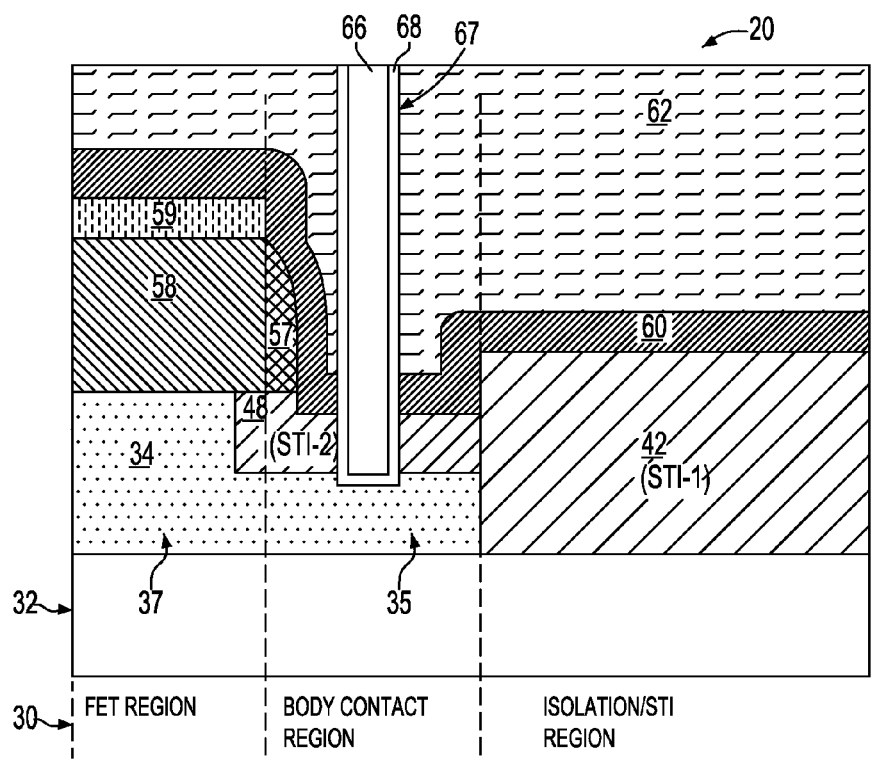

A body contact will now be formed as shown in FIGS. 18 to 20. Referring now to FIG. 18, a via opening 64 has been formed in oxide layer 62. The via opening 64 may be made by a process such as Reactive Ion Etching (RIE).

Referring now to FIG. 19, via opening 64 has been extended through nitride layer 60 and oxide layer 48 by RIE. Via opening 64 extends to and contacts SOI extension 35 of the SOI layer 34.

Referring now to FIG. 20, via opening 64 is filled with a conductor 66 such as tungsten, which can be deposited by a Chemical Vapor Deposition (CVD) process. Preferably, there is also a liner 68 lining the via opening 64. This liner can be, for example, titanium nitride (TiN) deposited by evaporation or sputtering. After deposition of the liner 68 and metal fill 66, a CMP process is used to remove these materials from the horizontal surfaces to leave them only within via opening 64. The body contact 67 as shown in FIG. 20 has now been completed.

The SOI device 20 as shown in FIG. 20 is now complete and includes an FET region, a body contact region and an STI region. STI-2 48 on the SOI extension 35 of the SOI layer 34 serves the same function as conventional STI and the additional function of facilitating an SOI extension 35 of the SOI layer under this STI that is connected to the body 37 of the FET. Another function of STI-2 is the complete blocking of the source/drain implants such that the SOI extension 35 of the SOI layer 34 not under the gate polysilicon is of the same conductivity type as the body 37 under the gate polysilicon thus providing an ohmic, low resistance, self aligned contact to the body 37 of the FET.

The process for forming silicided body contacts in SOI device 20' now will be described with reference to FIGS. 21 to 27.

Figure 21:
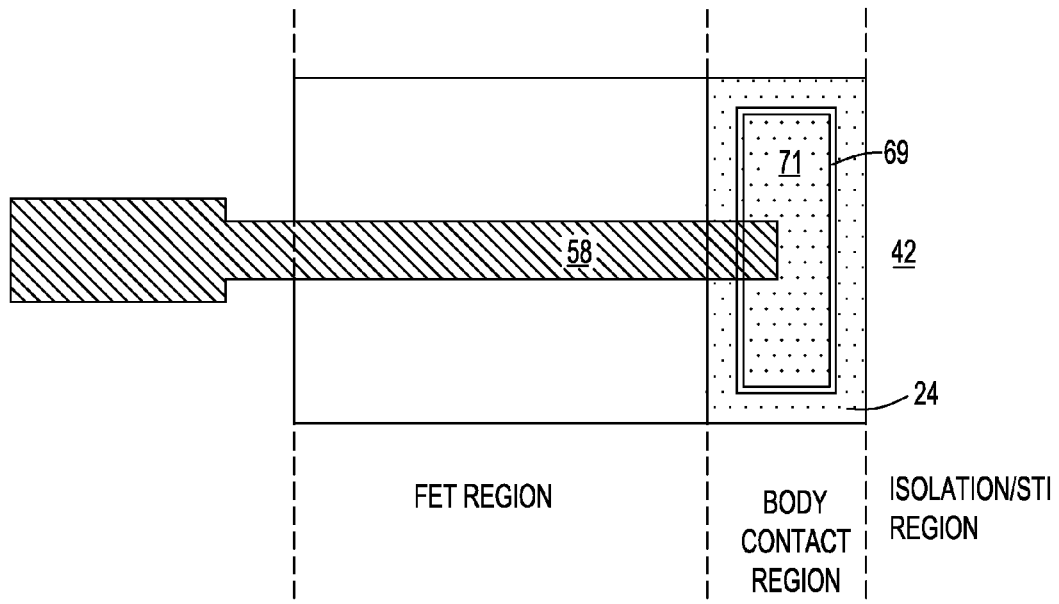
FIGS. 21 to 27 illustrate a second process for making body contacts for the SOI device of FIG. 2.
Figure 22:
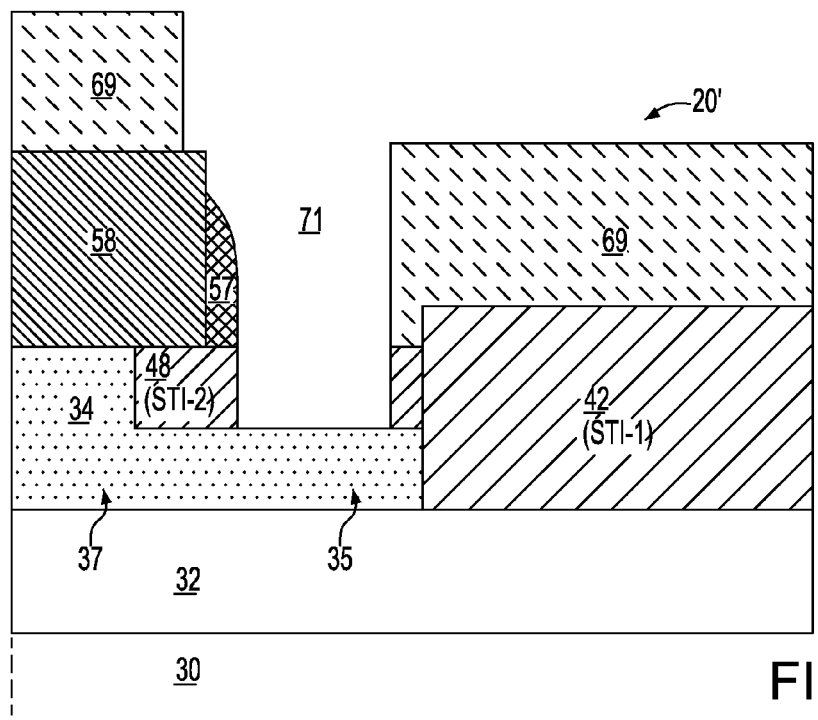

Referring now to FIG. 21, which is a top down view of SOI device 20', a photoresist mask 69 has been applied which blocks the SOI device 20' except for a portion of the body contact region 24. The opening 71 in the mask 69 is where the SOI extension 35 of the SOI layer 34 will be silicided. FIG. 22 shows a cross section of SOI device 20' after etching of STI-2 oxide 48 through opening 71 of mask 69 to extend opening 71 through STI-2 oxide 48 and expose SOI extension 35 of SOI layer 34. The etching is done using a RIE process that selectively etches oxide while not significantly etching nitride spacer 57, polysilicon gate 58, silicon 34 or photoresist 69 so that the opening in oxide 48 is self aligned to the gate polysilicon 58.

Figure 23:
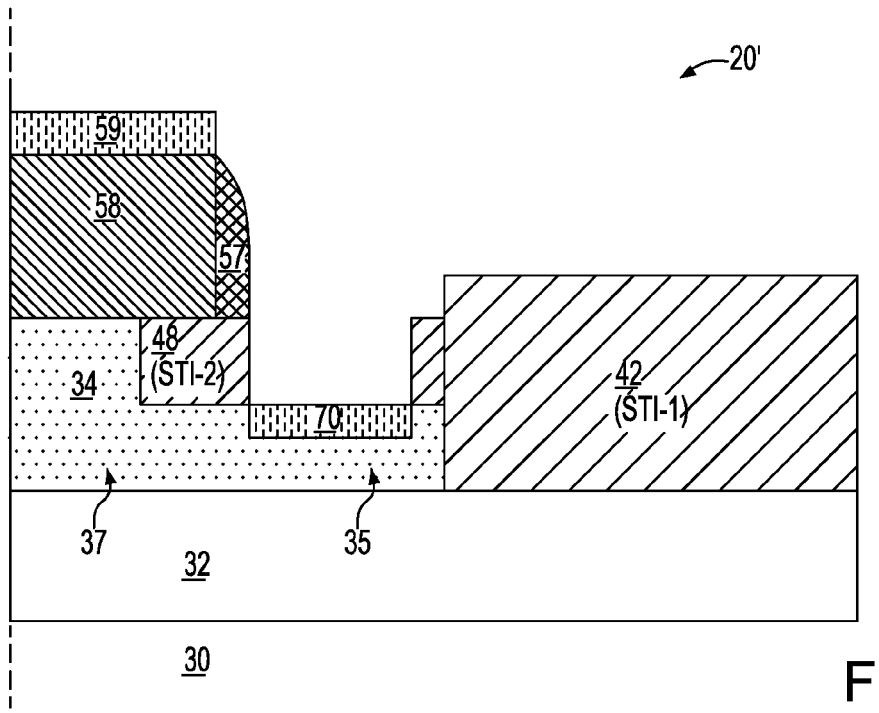

Referring now to FIG. 23, the polysilicon gate 58 and the exposed SOI extension 34 of the SOI layer 34 have been silicided using a conventional self-aligned silicide formation process as is well known in the art. The portion of the SOI extension 35 of the SOI layer 34 that has been silicided is denoted by reference number 70 while the portion of the gate polysilicon 58 that has been simultaneously silicided is denoted by reference number 59.

Figure 24:
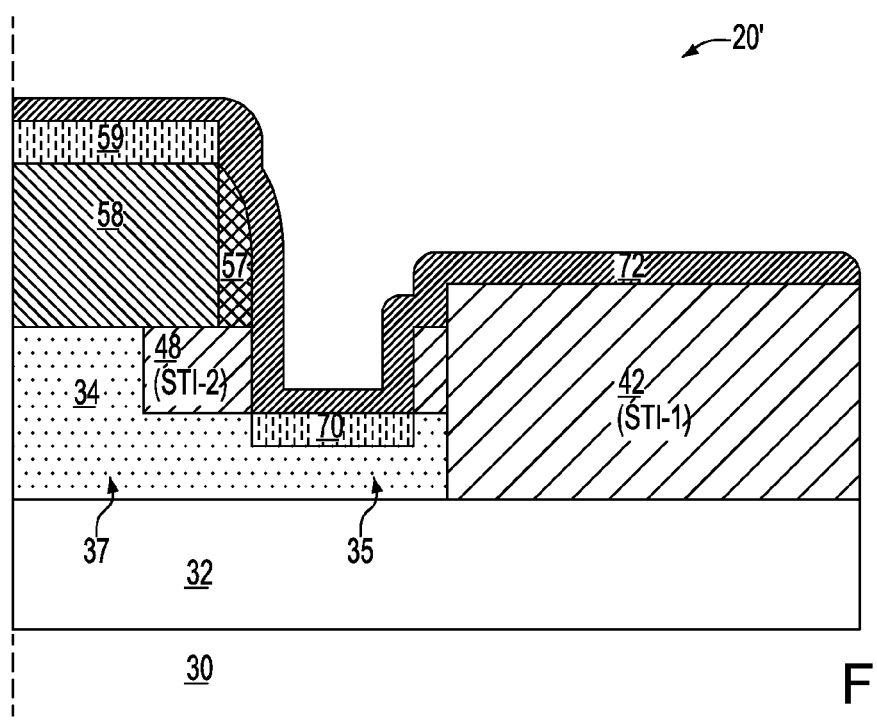

Referring now to FIG. 24, a conformal layer 72 of nitride has been applied over the FET device 20'. The thickness of the conformal nitride layer 72 is approximately 10-100 nm.

Figure 25:
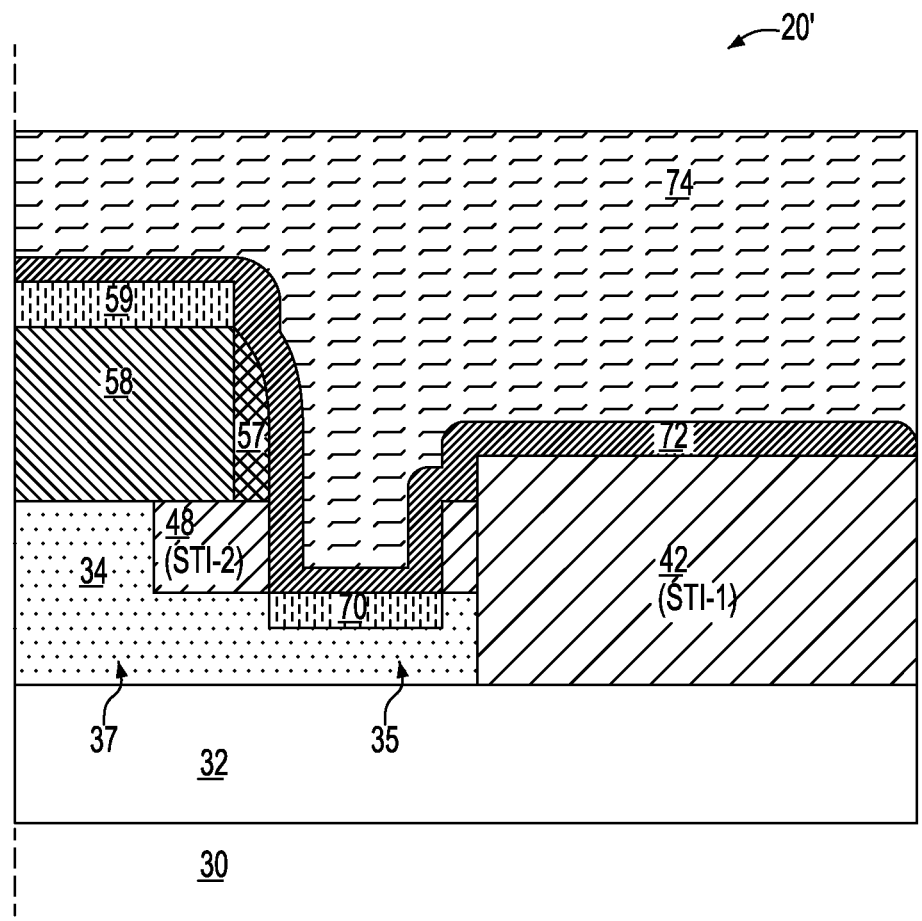

Referring now to FIG. 25, a layer of oxide 74 has been blanket deposited and then conventionally planarized using CMP.

Figure 26:
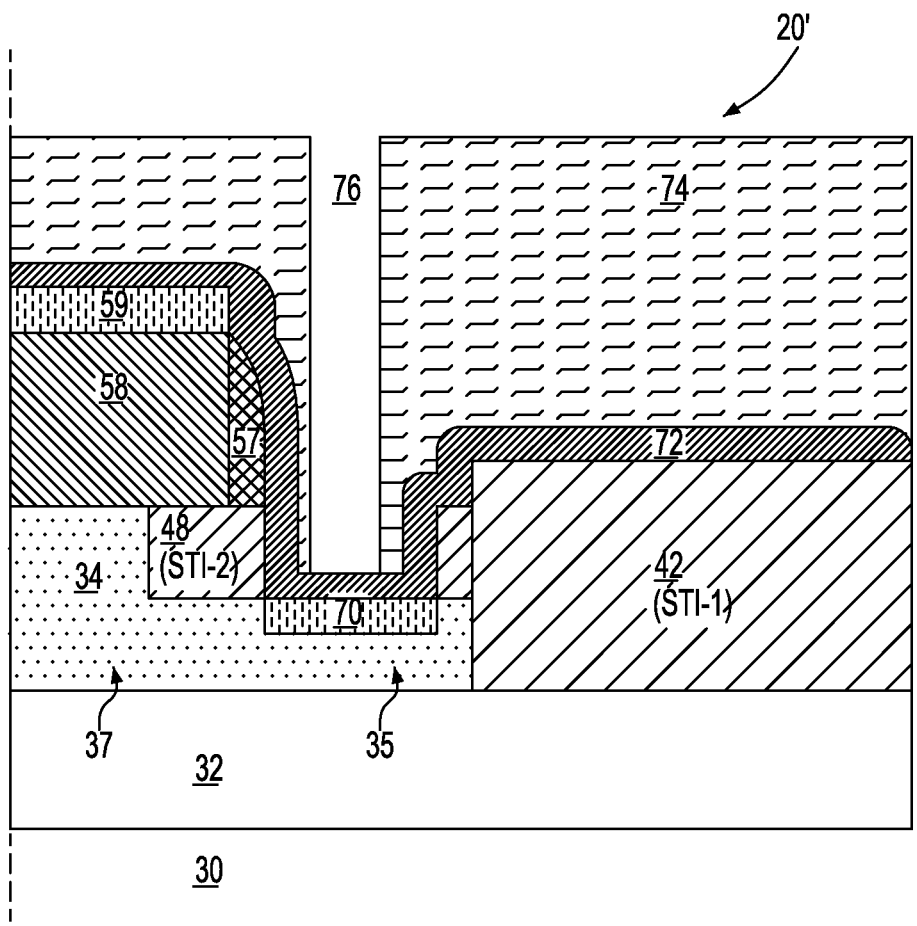
Figure 27:
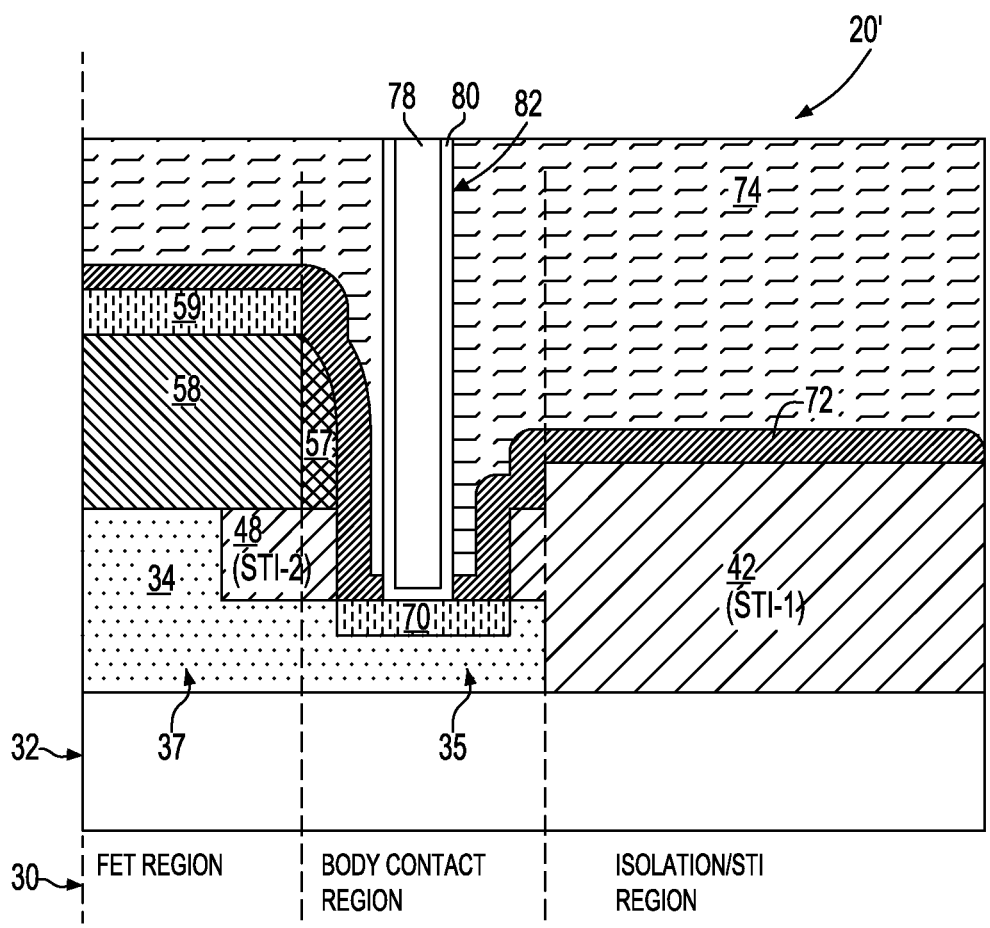

A body contact will now be formed as shown in FIGS. 26 and 27. Referring now to FIG. 26, a via opening 76 has been formed in oxide layer 74. The via opening 76 may be made by a process such as RIE.

Referring now to FIG. 27, via opening 76 has been extended through nitride layer 72 by a RIE process to expose the silicided portion 70 of SOI extension 35 of SOI layer 34 followed by filling via opening 76 with a conductor 78 such as tungsten, which can be deposited by a Chemical Vapor Deposition (CVD) process. Preferably, there is also a liner 80 lining the via opening 76. This liner can be, for example, TiN deposited by evaporation or sputtering. After deposition of the liner 80 and metal fill 78, a CMP process is used to remove these materials from the horizontal surfaces to leave them in the via opening 76 only. The body contact 82 as shown in FIG. 27 is now complete. As can be seen, the body contact 82 makes contact between the silicided portion 70 and the surface of the SOI device 20'.

The SOI device 20' as shown in FIG. 27 is now complete and includes an FET region, a body contact region and an STI region.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. An SOI device comprising:
   an FET region comprising an SOI layer, the FET region having a gate on the SOI layer;
   an STI region having a first STI layer separating the SOI device from an adjacent SOI device, the first STI layer having a first thickness and extending entirely through the SOI layer, the first STI layer at a first level with respect to a bottom of the SOI layer;
   a body contact region between the FET region and STI region, the body contact region having an extension of the SOI layer and an overlying second STI layer in the body contact region having a second thickness; and
   a body contact in contact with the SOI extension, the body contact extending through the second STI layer and the body contact stopping on the SOI extension;
   wherein the SOI layer and the second STI layer are at a second level with respect to the bottom of the SOI layer and the gate is partially extending from the SOI layer over the second STI layer and being at the same level over the second STI layer as over the SOI layer;
   wherein the first level is different than the second level;
   wherein the first thickness is different than the second thickness and
   wherein the first and second layers of STI form a contiguous, split-level STI.

2. The SOI device of claim 1 wherein the SOI device has a top surface and the body contact region is beneath the top surface.

3. The SOI device of claim 1 wherein the body contact extends from the SOI extension to a top surface of the SOI device.

4. The SOI device of claim 1 wherein the body contact extends from the SOI extension to a top surface of the SOI device.

5. The SOI device of claim 1 wherein the first thickness is greater than the second thickness.

6. The SOI device of claim 1 wherein the second STI layer extends into the FET region.

7. An SOI device comprising:
   a bulk silicon layer;
   an FET region, body contact region and STI region;
   the FET region comprising an SOI layer and a gate on the SOI layer;
   the STI region having a first STI layer separating the SOI device from an adjacent SOI device, the first STI layer having a first thickness;

the body contact region between the FET region and STI region, the body contact region having an extension of the SOI layer and an overlying second STI layer having a second thickness;
a layer of silicide on the gate and the SOI extension; and
a body contact in contact with the SOI extension and layer of silicide on the SOI extension, the body contact avoiding direct contact with the first and second STI layers;
wherein the first thickness is different than the second thickness.

8. The SOI device of claim 7 wherein the SOI device has a top surface and the body contact region is beneath the top surface.

9. The SOI device of claim 7 wherein the body contact extends from the SOI extension to a top surface of the SOI device.

10. The SOI device of claim 7 wherein the gate is partially extending over the second STI layer.

11. The SOI device of claim 10 wherein the body contact extends from the SOI extension to a top surface of the SOI device.

12. The SOI device of claim 7 wherein the body contact extends from the silicide on the SOI extension to a top surface of the SOI device.

13. The SOI device of claim 7 wherein the first thickness is greater than the second thickness.

14. The SOI device of claim 7 wherein the second STI layer extends into the FET region.

15. A method of forming an SOI device comprising the steps of:
forming an FET region comprising an SOI layer, the FET region having a gate on the SOI layer;
forming an STI region having a first STI layer separating the SOI device from an adjacent SOI device, the first STI layer having a first thickness and extending entirely through the SOI layer, the first STI layer at a first level with respect to a bottom of the SOI layer;
forming a body contact region between the FET region and STI region, the body contact region having an extension of the SOI layer and an overlying second STI layer in the body contact region having a second thickness, forming the second STI layer so as to be at a same level as the SOI layer such that the second STI layer and the SOI layer are at a second level with respect to a bottom of the SOI layer, the gate partially extending from the SOI layer over the second STI layer and being at the same level over the second STI layer as over the SOI layer, wherein the first level is different than the second level; and
forming a body contact in contact with the SOI extension, the body contact extending through the second STI layer and the body contact stopping on the SOI extension;
wherein the first thickness is different than the second thickness; and
wherein the first and second layers of STI form a contiguous, split-level STI.

16. A method of forming an SOI device comprising the steps of:
obtaining a substrate having a bulk silicon layer;
forming a buried oxide layer on the bulk silicon;
forming a patterned silicon layer on the buried oxide layer, the patterned silicon layer comprising a first portion and an extension contiguous with the first portion, the extension being thinner than the first portion;
forming an oxide layer comprising a first STI region on the buried oxide layer and adjacent to the extension and a second STI region on the extension, the first and second STI regions forming a contiguous split level STI in the silicon layer such that the first and second STI regions having different thicknesses;
forming a gate on the first portion of the silicon layer, the gate and first portion of the silicon layer comprising an FET region;
removing a portion of the second STI region to expose the extension;
forming a layer of silicide on the gate and on the SOI extension;
forming a body contact in contact with the extension and layer of silicide, the body contact avoiding direct contact with the first and second STI layers, wherein the body contact, extension and second STI layer form a body contact region.

17. The method of forming an SOI device of claim 16 wherein the body contact extends from the silicide on the SOI extension to a top surface of the SOI device.

* * * * *